United States Patent
Tay et al.

(10) Patent No.: US 7,331,503 B2
(45) Date of Patent: Feb. 19, 2008

(54) SOLDER PRINTING PROCESS TO REDUCE VOID FORMATION IN A MICROVIA

(75) Inventors: Cheng Siew Tay, Penang (MY); Pek Chew Tan, Penang (MY); Swee Kian Cheng, Kedah (MY); Eng Hooi Yap, Penang (MY)

(73) Assignee: Intel Corporation, Santa Clara, CA (US)

( * ) Notice: Subject to any disclaimer, the term of this patent is extended or adjusted under 35 U.S.C. 154(b) by 349 days.

(21) Appl. No.: 10/976,980

(22) Filed: Oct. 29, 2004

(65) Prior Publication Data

US 2006/0091188 A1 May 4, 2006

(51) Int. Cl.
*B23K 31/02* (2006.01)
(52) U.S. Cl. .................... 228/226; 228/248.1
(58) Field of Classification Search .................. None
See application file for complete search history.

(56) References Cited

U.S. PATENT DOCUMENTS

| | | | | |
|---|---|---|---|---|
| 5,385,290 A | * | 1/1995 | Degani | 228/180.22 |
| 5,803,340 A | * | 9/1998 | Yeh et al. | 228/56.3 |
| 6,030,889 A | * | 2/2000 | Aulicino et al. | 438/613 |
| 6,109,507 A | * | 8/2000 | Yagi et al. | 427/97.2 |
| 6,193,143 B1 | * | 2/2001 | Ishikawa | 228/245 |
| 6,264,097 B1 | * | 7/2001 | Sano | 228/245 |
| 6,348,401 B1 | * | 2/2002 | Chen et al. | 438/617 |
| 6,457,633 B1 | * | 10/2002 | Takashima et al. | 228/248.1 |
| 6,513,701 B2 | * | 2/2003 | Mead et al. | 228/248.1 |
| 6,736,308 B1 | * | 5/2004 | Downes | 228/248.1 |
| 6,857,361 B2 | * | 2/2005 | Sakai et al. | 101/129 |
| 6,861,346 B2 | * | 3/2005 | Tong et al. | 438/613 |
| 7,223,633 B2 | * | 5/2007 | Key et al. | 438/108 |
| 2004/0041001 A1 | * | 3/2004 | Shaeffer et al. | 228/33 |

FOREIGN PATENT DOCUMENTS

| | | | |
|---|---|---|---|
| JP | 60-234793 | * | 11/1985 |
| JP | 5-111761 | * | 5/1993 |
| JP | 6-142975 | * | 5/1994 |

OTHER PUBLICATIONS

Johnson, Alden. Tutorial: How to Select the Best Stenci [online], May 2003 [retrieved on Jan. 13, 2007]. Retrieved from the Internet:<URL: http://web.archive.org/web/20030512003557/ http://www.chipscalereview.com/issues/0403/f5_01.php>.*

* cited by examiner

*Primary Examiner*—Kiley Stoner
(74) *Attorney, Agent, or Firm*—Blakely, Sokoloff, Taylor & Zafman LLP

(57) ABSTRACT

In one embodiment, a method is provided. The method comprises filling a microvia formed in a bond pad with solder paste comprising solder balls of the first size; and coating the bond pad with solder paste comprising solder balls of the second size, wherein the second size is greater than the first size.

6 Claims, 11 Drawing Sheets

| Tk (gram) | D (mil) | 120%D (mil) |
|---|---|---|
| 40 | 3.7 | 4.4 |
| 50 | 4.6 | 5.5 |
| 60 | 5.5 | 6.7 |
| 70 | 6.5 | 7.8 |

FIGURE 4

Type 4/5 solder powder in relatively smaller than Type 3 and microvia size thus tendency to fill the hole is much higher thus no air will be trapped.

SOLDER PRINTING PROCESS TO REDUCE VOID FORMATION IN A MICROVIA

FIELD OF THE INVENTION

Embodiments of the invention relate to the fabrication of electronic components, and in particular to the fabrication of high density interconnects, using microvia technology.

BACKGROUND

Microvia technology has enabled the development of high density interconnects for electronic components, and plays a crucial role in high density printed circuit board (PCB) and substrate design. However, one problem associated with microvia technology is the formation of solder voids in the solder joints formed in the microvias themselves. FIG. 1 of the drawings shows a cross sectional photograph of a solder joint, which includes a void. Referring to FIG. 1, reference numeral 100 indicates a bond pad of a printed circuit board (PCB), and reference numeral 102 indicates a bond pad of a semiconductor die/substrate 102 which is attached to the substrate. As will be seen, the bond pad 100 includes a generally U-shaped microvia formed therein. A solder material 104 is disposed between the bond pad 102, and the bond pad 100 and serves to electrically & mechanically connect the semiconductor die to the substrate or package to PCB. For good electrical & mechanical connection, the solder material 104 is required to completely fill the microvia in the bond pad 100. However, as can be seen from FIG. 1 of the drawings, the microvia is not completely filled with the solder material 104 as it includes an air pocket, which is solder free. The air pocket is referred to as a void, or process void. The presence of the void in the microvia can adversely affect the mechanical and electrical properties of a solder joined formed by the solder material 104.

BRIEF DESCRIPTION OF THE DRAWINGS

FIG. 4 is a table which shows how a minimum diameter D of a microvia required to fill a microvia with solder paste, varies with the tacky force of the solder paste;

FIG. 7 schematically illustrates the filling of a microvia with solder paste of a second size;

FIG. 10 shows a schematic drawing of the printing table of FIG. 9, in greater detail.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The presence of a void or "solder free pocket" within a microvia is directly related to the amount of solder paste that enters or fills the microvia during solder printing. Further, the amount of solder paste that enters or fills the microvia during solder printing is related to the lateral dimension or diameter of the microvia. In one embodiment of the invention, a technique is disclosed to calculate or determine the minimum size/diameter of a microvia that is required in order to eliminate, or at least reduce void formation in a later formed solder joint.

Figure 1:
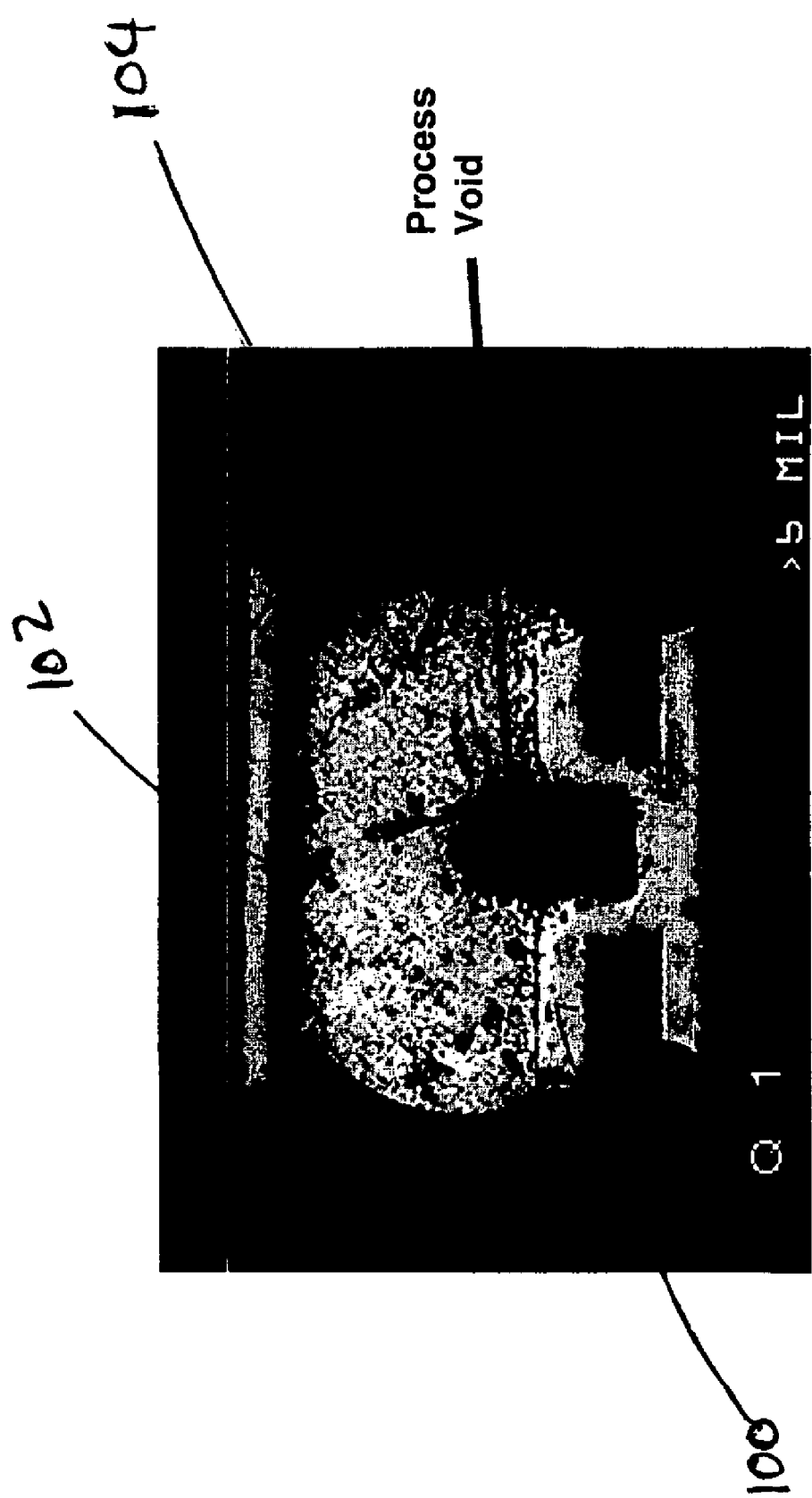
FIG. 1 shows a cross-sectional photograph of a solder joint in which a solder void may be seen.
Figure 2:
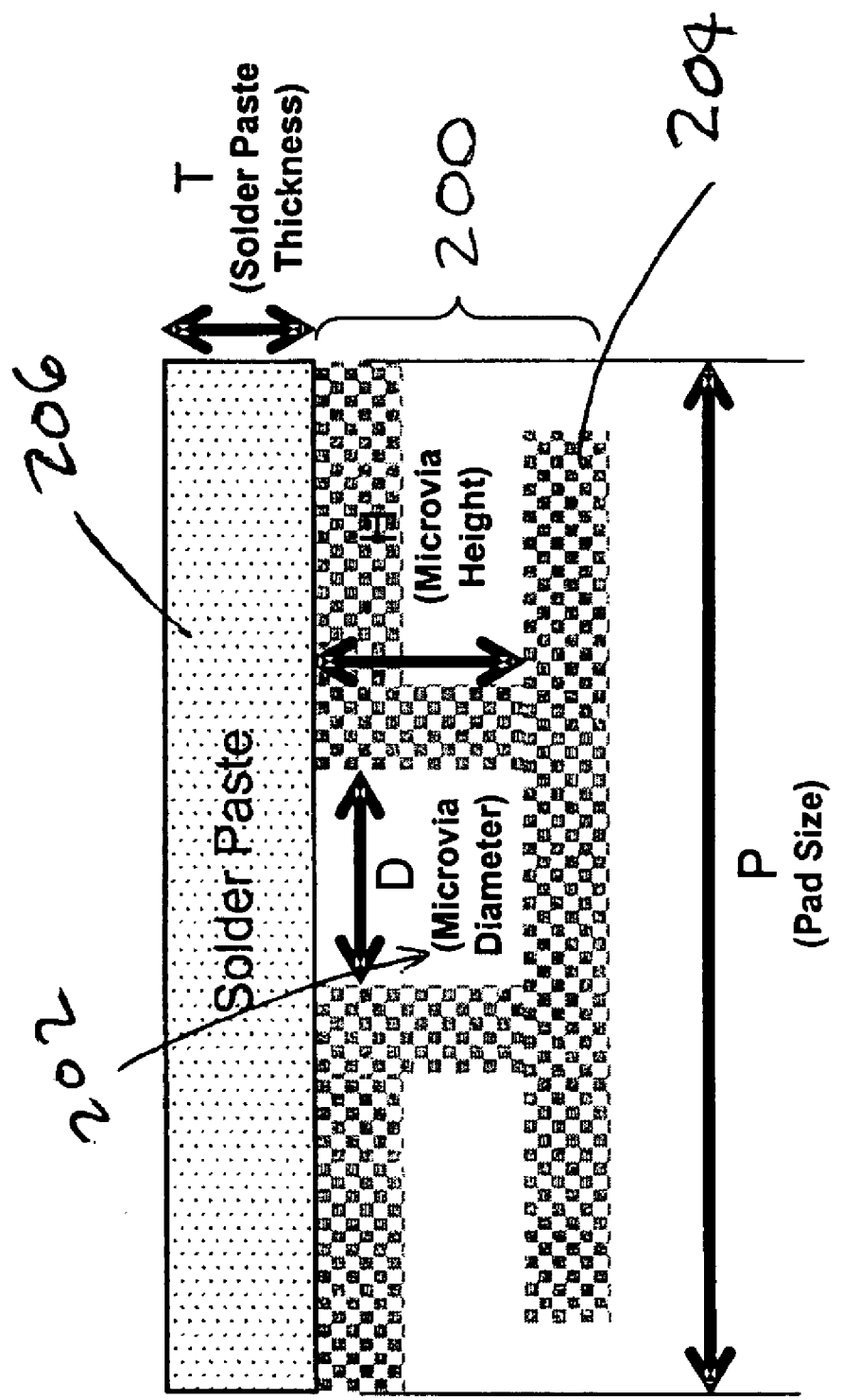
FIG. 2 is a schematic drawing that illustrates the parameters associated with the filling of a microvia with solder paste.

The various parameters used to calculate the minimum diameter are shown in FIG. 2 of the drawings. Referring to FIG. 2, reference numeral 200 indicates a bond pad with a microvia 202 formed therein. As will be seen, the bond pad 200 is connected to an inner layer 204, which may, for example be an internal layer of a printed circuit board (PCB). The microvia 202 has a height H, and a diameter D. In FIG. 2, reference numeral 206 indicate solder paste printed on the bond pad 200 during a solder printing operation. The solder paste 206 has a thickness T. Further, the bond pad 200 has a diameter P.

Figure 3:
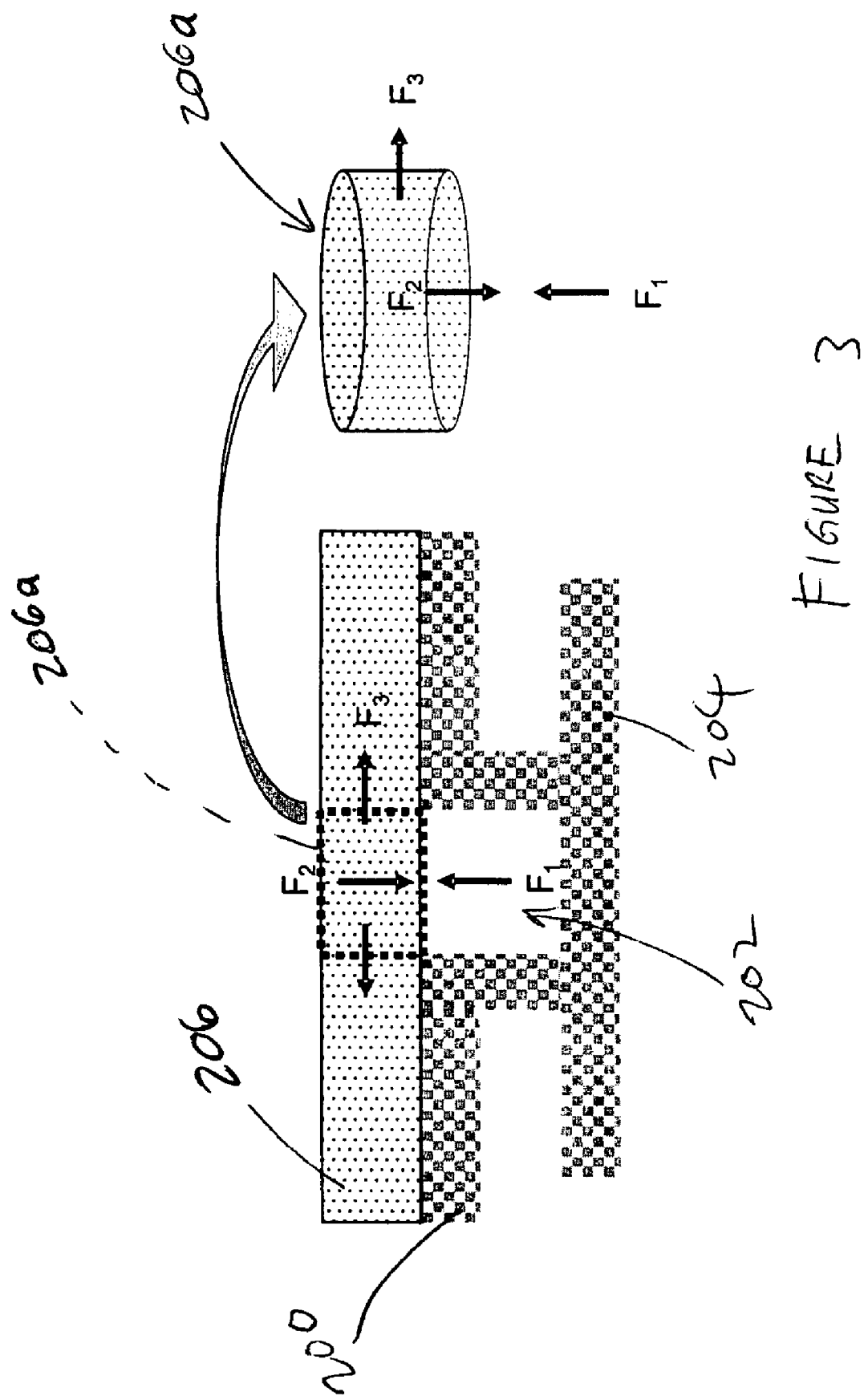
FIG. 3 illustrates the forces acting on a volume of solder paste required to fill a microvia.

Referring now to FIG. 3 of the drawings, the forces exerted on a volune of solder paste 206a required to completely fill the microvia 202 is indicated as $F_1$, $F_2$, and $F_3$. In order for the block 206A to completely fill the microvia 202 the following condition has to be satisfied:

$$F_2 > F_1 + F_3$$

In one embodiment, the minimum diameter D for the microvia 202 in order for the volume 206a to completely fill the microvia 202 may be calculated using the following equation:

$$F_2 - F_3 - F_1 \geq 0$$
$$\rho_s g V_s - T_k A_s - \rho_a g V_v \geq 0$$
$$\rho_s g \left(\frac{\pi D^2}{4}\right) T - T_k (\pi D T) - \rho_a g \left(\frac{\pi D^2}{4}\right) H \geq 0$$
$$\Rightarrow D(\rho_s g T - \rho_a g H) - 4 T_k T \geq 0$$
$$\Rightarrow D \geq \frac{4 T_k T}{(\rho_s g T - \rho_a g H)}$$

where $F_1$, $F_2$, $F_3$ are force due to pressure in the microvia, weight of solder paste above microvia and tacky force from the solder paste respectively.

$\rho_s$, $\rho_a$ density of solder & air in microvia respectively.

$V_s$, $V_a$ are volume of solder & air in microvia respectively.

$T_k$ is the tacky force of solder paste.

T, H, D are solder paste thickness (printed), microvia height & diameter of microvia respectively.

Figure 4:
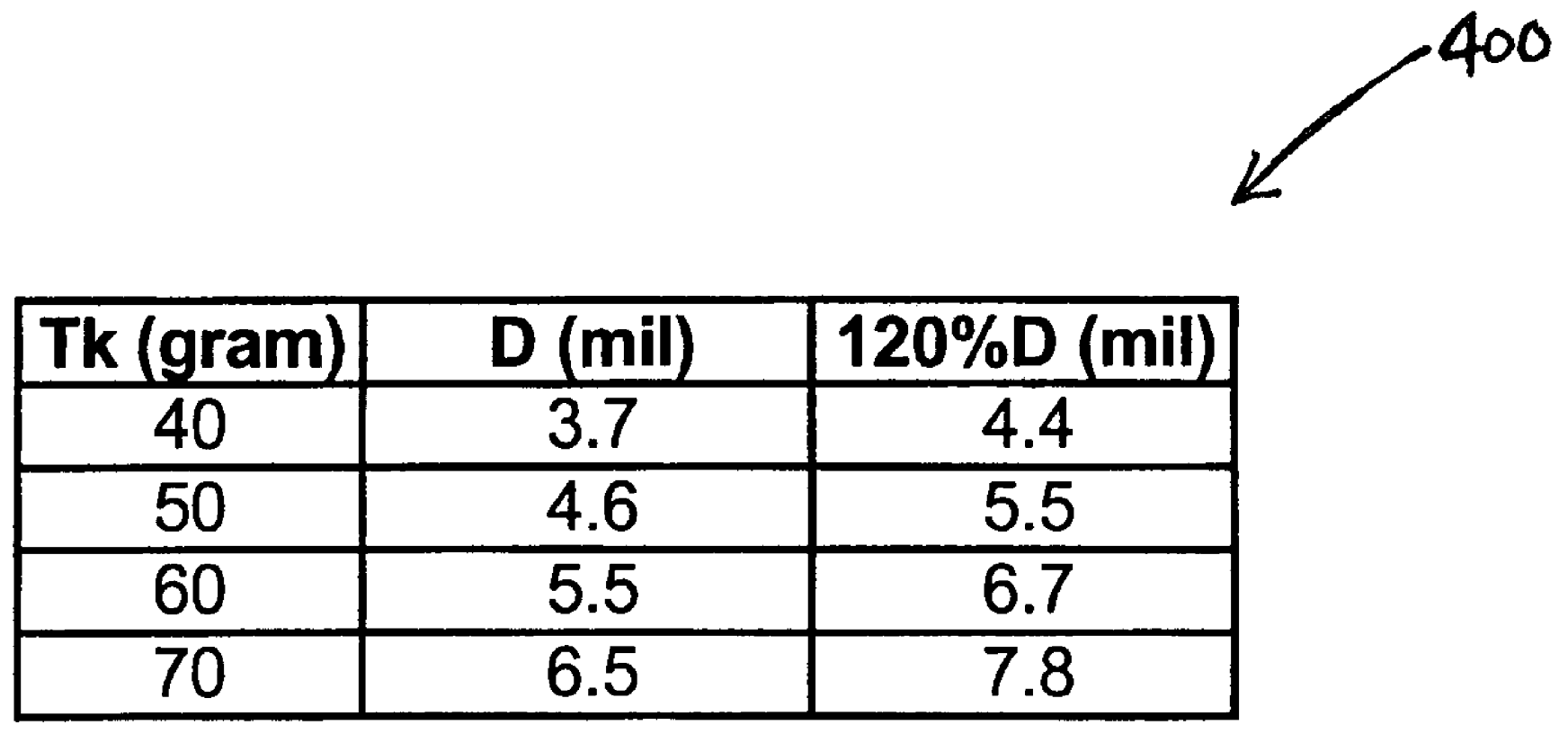

As will be noted, $T_k$ is a key contributor to the minimum diameter D in the above equation. With H, and T set at 5 mm, the Table 400 of FIG. 4 shows the minimum diameter D, at various values of $T_k$.

| $T_k$ (grams) | D (millimeters) | 120% D (millimeters) |
|---|---|---|
| 40 | 3.7 | 4.4 |
| 50 | 4.6 | 5.5 |
| 60 | 5.5 | 6.7 |
| 70 | 6.5 | 7.8 |

In one embodiment, instead of using the minimum diameter D, a larger value for example 120% of the minimum diameter D is used in order to accommodate variances in the actual size of the microvia 202 as a result of the fabrication process.

Using the above table, it will be seen that for a $T_k$ value of around 50-60 grams, 120% of the minimum diameter D is around 7 mm. Current formulations for solder paste have a $T_k$ of around 50-60 grams, and current microvia designs have a diameter of 6 mm. This implies that there would be a certain percentage of yield loss due to the formation of solder voids in the microvias.

One advantage of predicting the minimum microvia diameter D that is required to completely fill a microvia with solder paste, is that formation of solder voids in the microvia can be eliminated, or at least reduced by altering the parameters (a) of the solder printing process or (b) the solder paste that is used in the solder printing process in order to ensure that the actual diameter of the microvia is less than or equal to the minimum diameter D predicted by the above formula. Alternatively, the microvias themselves can be designed so that they have an actual diameter that is at least equal to the calculated minimum diameter D for a given solder paste, and solder paste printing process. Accordingly, solder voids need not be detected after formation of the solder joints, but instead can be predicted a priori, and the process parameters can be accordingly modified so as to eliminate or at least reduce the formation of process voids in the solder joints.

Figure 5:
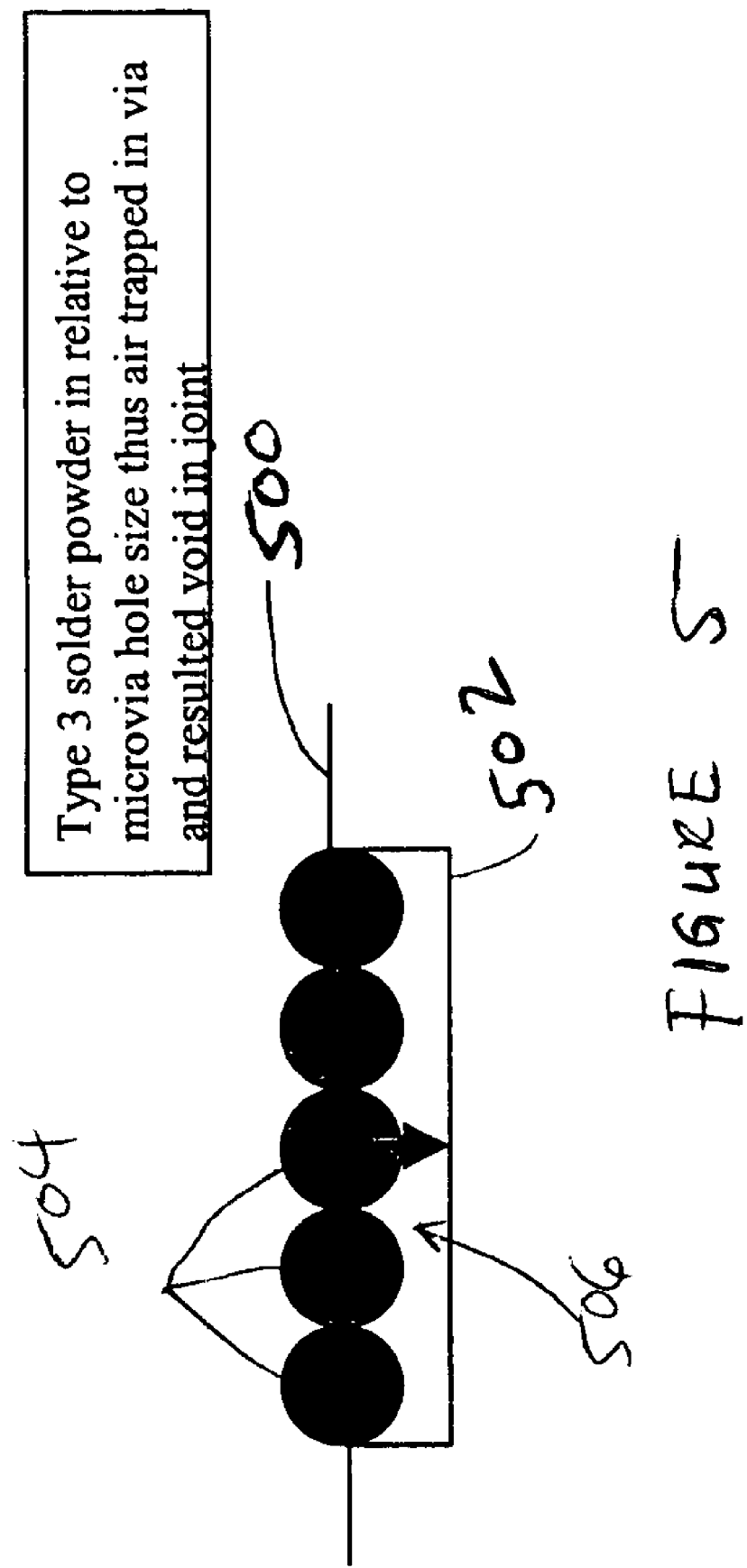
FIG. 5 schematically illustrates the process of filling a microvia with solder paste having particles of a first size.

Techniques for eliminating or at least reducing the formation of solder voids in the solder joints, will now be described, with reference to FIGS. 5 to 10 of the drawings. FIG. 5 shows a bond pad 500 with a microvia 502 formed therein. Reference numeral 504 indicates solder particles that have been deposited in the microvia 502 during a conventional solder printing process. The solder particles 504 have a certain size in relation to the diameter of the microvia 502. FIG. 5 of the drawings is intended to illustrate that because of the size of the solder particles 504 in relation to the diameter of the microvia 502, an air pocket 506 forms in the microvia 502 and prevents further solder particles 504 entering the microvia 502. During subsequent solder joint formation, the air pocket 506 forms a solder void which weakens the mechanical and electrical properties of the solder joint. In one embodiment, a minimum of four solder particles are required to span the microvia diameter in order to fill the microvia.

Figure 6:
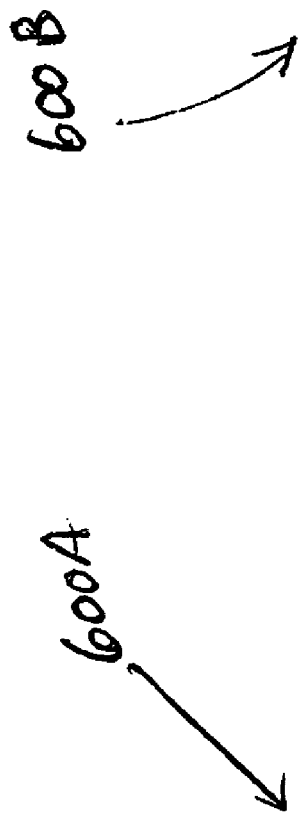
FIG. 6 includes tables that show the characteristics of solder paste of Type 3, Type 4, and Type 5.
Figure 2:
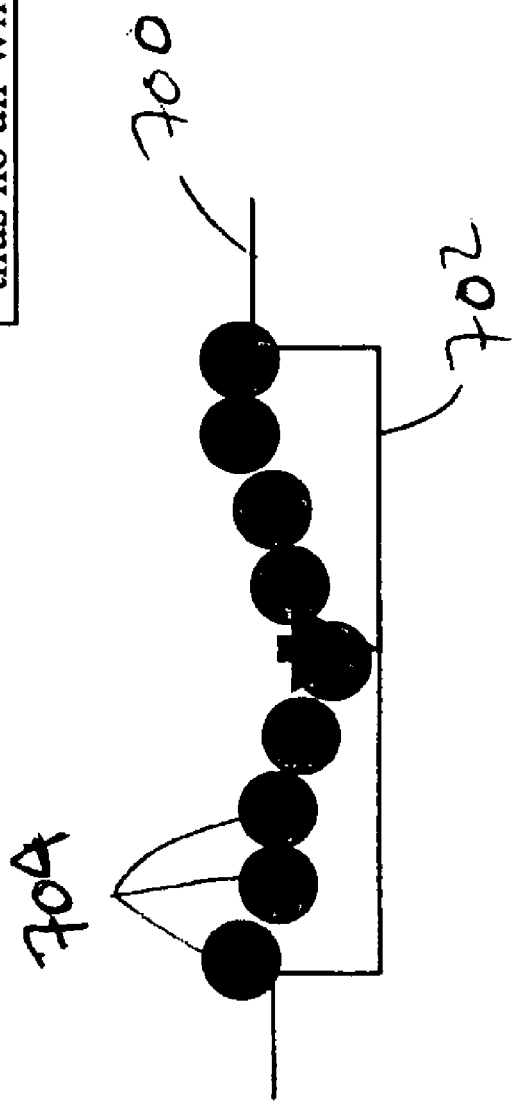

Referring now to FIG. 6 of the drawings, Table 600A indicates the various types of solder paste used in today's surface mount technology (SMT), in terms of their respective solder particle size. Further, Table 600B indicates the number of solder particles of each solder paste type that is required to fill a microvia having a diameter of 6 mm.

Referring to Table 600A, it will be seen that Type 3 solder paste includes solder particles having a size of 0.98 mm to 1.77 mm. Further, it will be seen from Table 600B, that between three and six solder particles of Type 3 are required to fill a microvia having a diameter of 6 mm.

From Tables 600A, and 600B, it will seen that the smaller particle size solder types would lead to a more complete filling of a microvia. For example, referring to FIG. 7 of the drawings, a bond pad 700 with a via 702 formed therein, is shown filled with Type 4 solder paste. Because Type 4 solder paste has a particle size that is less than the particle size of Type 3 solder paste, more particles fill the via 702 with the result that formation of an air pocket 706 is reduced.

However, the problem with using a smaller particle solder type is that solder paste with particles of a smaller size oxidize more easily than solder paste with particles of a larger size.

Figure 8A:
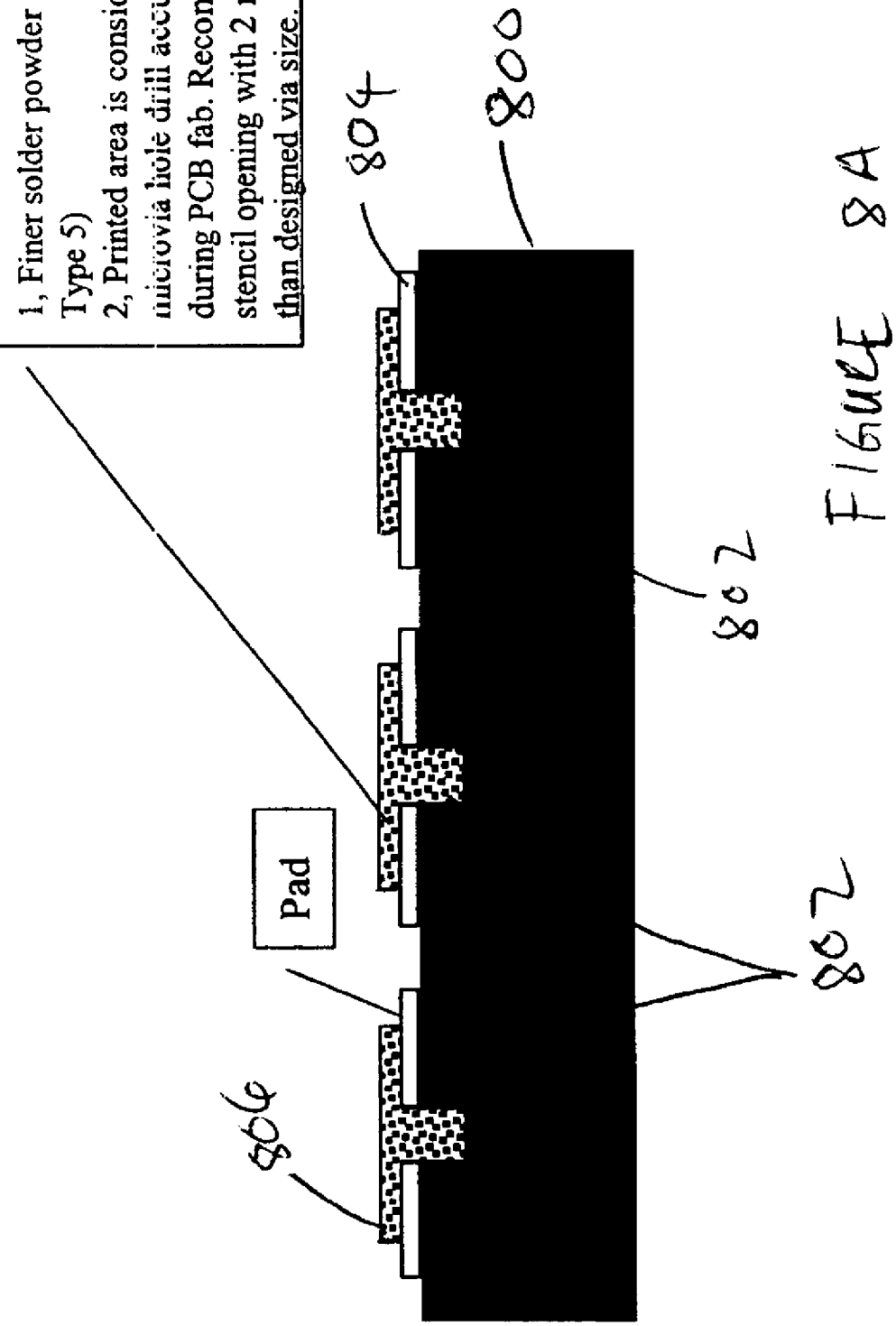
FIGS. 8A and 8B illustrates steps in a dual-stage solder printing process, in accordance with one embodiment of the invention.

In one embodiment, a dual-stage solder printing process is employed. In a first solder printing operation, solder paste of reduced particle size is used to fill a microvia. For example, in one embodiment, a Type 4, or a Type 5 solder paste may be used. This is illustrated in FIG. 8A of the drawings, where microvias 800 formed in bond pads 802 on a substrate 804 are filled with a solder paste 806 comprising solder particles of reduced size, for example solder particles of Type 4, or Type 5. It will be seen from FIG. 8A of the drawings, that the lateral extent of the printed solder paste 806 exceeds the size of the microvias 802. This is because, in accordance with one embodiment, a printing stencil with apertures larger than the diameters of the microvias 800 is used, in order to accommodate for variances in the actual diameters of the microvias 802 due to the manufacturing process. For example, in one embodiment, the stencil has openings that are 2 mil larger than the designed via diameter. Thus, if the designed via diameter is 6 mil, then a stencil with openings of 8 mil will be used. Further, in accordance with one embodiment, the stencil has a reduced thickness which is less than the conventional 5 mm to 6 mm thickness. For example, in one embodiment, the thickness of the stencil may be equal to the thickness of the microvia hole depth. The object of the first printing using solder paste of a smaller particle size is to ensure that a sufficient volume of solder paste enters each microvia.

Figure 8B:
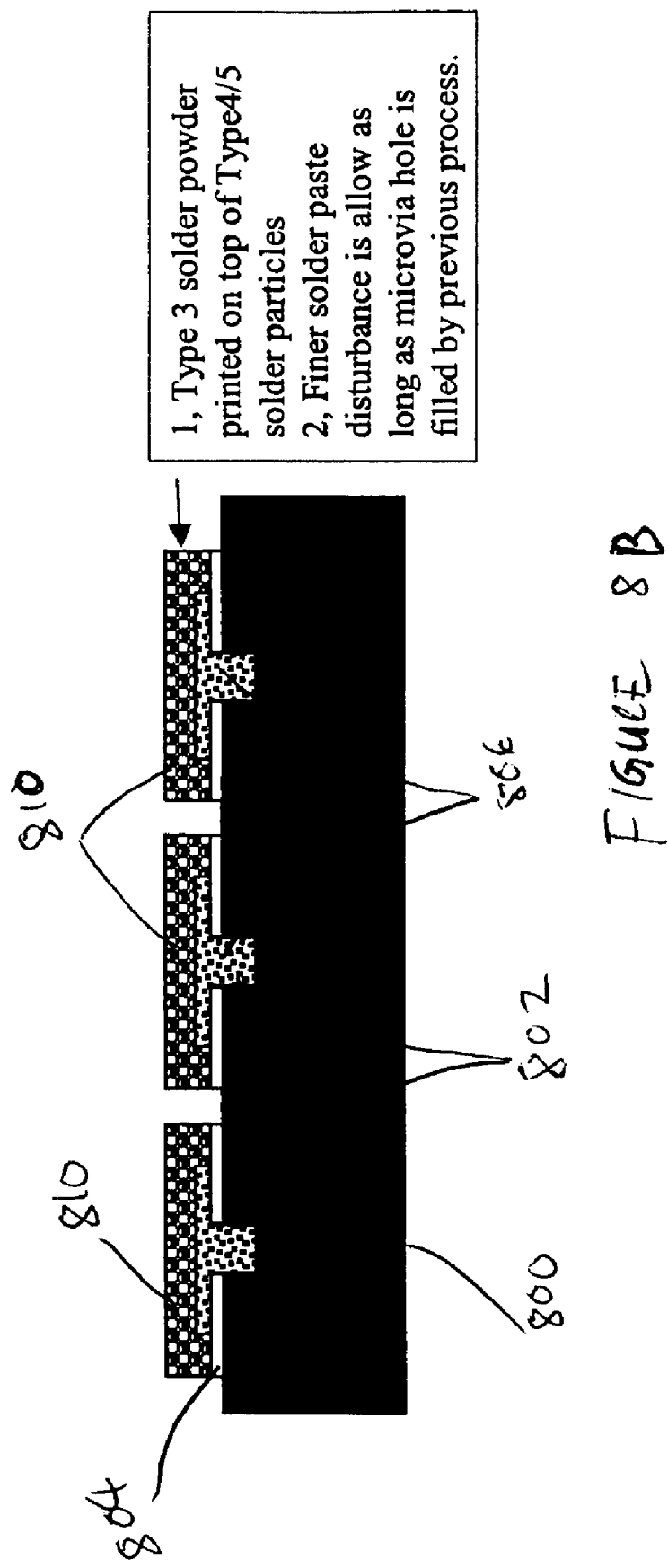

The next stage in the dual-stage solder printing process is to perform a second solder printing operation, wherein solder paste having solder particles of a larger size is used. This operation is illustrated in FIG. 8B of the drawings where it will be seen that solder paste 810 having solder particles of greater size is printed over the solder paste 806 which has the solder particles of reduced size. By using solder paste having a solder particle size greater than the solder paste used in the first solder paste printing operation, the problem of oxidation associated with using solder paste having particles of reduced size is avoided. Thereafter, a single reflow operation may be performed in order to ultimately form the solder joints.

In one embodiment, the solder paste used to perform the first solder printing operation may comprise particles of Type 4, and Type 5, whereas the solder paste used to perform the second solder paste printing operation will comprise particles of Type 3.

In order to improve the volume of solder paste that enters a microvia during solder paste printing, in one embodiment, the viscosity of the solder paste used in the solder paste printing process is selectively reduced.

Figure 9:
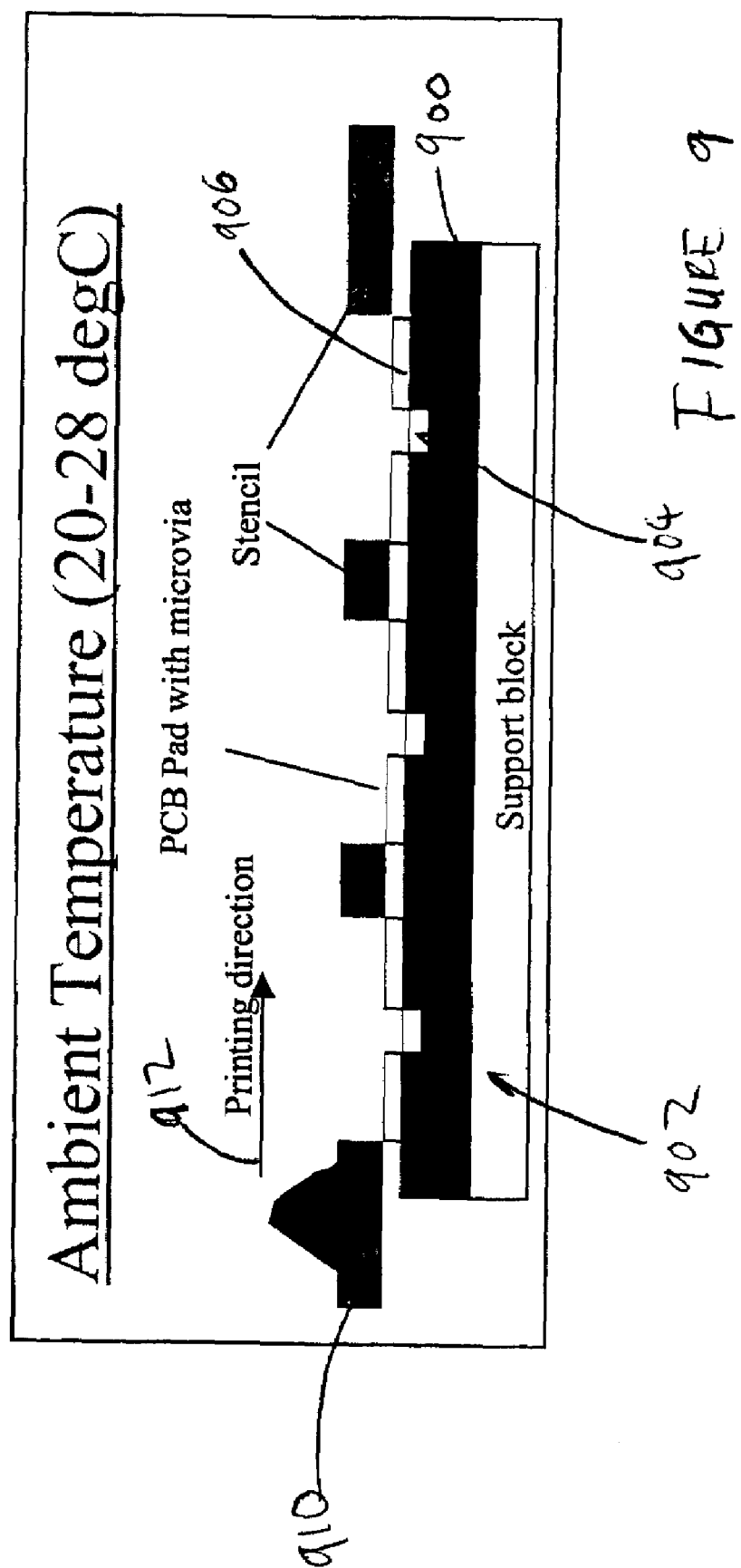
FIG. 9 illustrates a solder printing operation using a printing table, in accordance with one embodiment of the invention.
Figure 16:
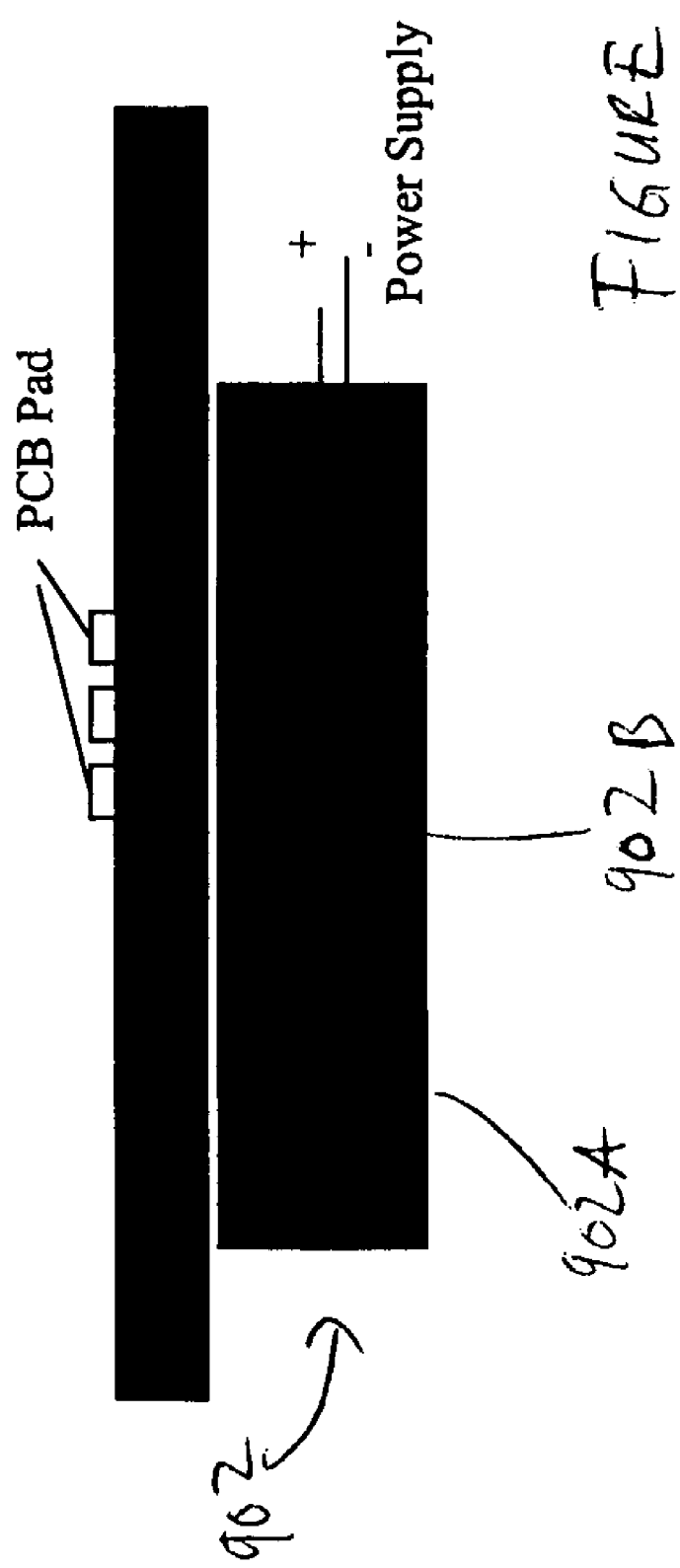

In one embodiment, the reduction in the viscosity of the solder paste is achieved by using a heating element in order to heat the solder paste as it is being printed. Accordingly, one embodiment of the invention includes providing a printing table that includes a heating element in order to selectively heat an area of bond pad in the vicinity of a microvia thereby to elevate the temperature of the solder paste being printed to reduce its viscosity and improve flow into the microvia. FIG. 9 of the drawings illustrates this embodiment of the invention. Referring to FIG. 9, a substrate is shown supported on a printing table 902. The printing table 902 is shown in further detail in FIG. 10 of the drawings. Referring to FIG. 10, it will be seen that a printing table 902 includes a support block 902A, and at least one heating element 902B. The heating element 902B may be operatively connected to a power/supply. Referring to FIG. 9 of the drawings, a number of microvias 904 are formed on bond pads 906. A stencil 908 having openings aligned with the microvias 904 selectively allows solder paste to flow into the microvias 904 when a printing component 910 is moved in the direction indicated by the arrow 912. The purpose of this heating element 902B is to selectively heat areas of the bond pad 906 adjacent to the microvias 904 thereby to increase the temperature of the solder paste being printed and to simultaneously reduce its viscosity, to promote the flow of the solder paste into the microvias 904. Due to its thixotropic characteristic, the viscosity of the solder paste will eventually return to its original viscosity. Thus, the problems associated with lower viscosity solder paste in general, such as post printing bridging defects, and defects due to post printing reflow, are avoided.

In one embodiment, the heating element 902B raises the temperature of the solder paste in the 5° C. to 10° C. range. This temperature range is high enough to lead to the benefits of reduced viscosity, while at the same time ensuring that the flux system does not evaporate at a higher rate. The flux system is important to ensure that contaminants are effectively removed before solder joint formation.

Embodiments of the invention disclose a printing table, with an embedded heating element, such as described above. Alternatively, the heating element may be a separate heating element used in conjunction with a conventional printing table, as required.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

The invention claimed is:

1. A method, comprising:
   filling a microvia formed in a bond pad with solder paste comprising solder balls of a first size wherein the solder paste used for filling the microvia comprises one of Type 4 and Type 5 solder paste; and
   coating the bond pad with solder paste comprising solder balls of a second size, wherein the second size is greater than the first size, wherein the solder paste used to coat the bond pad comprises Type 3 solder paste.

2. The method of claim 1, further comprising performing a single solder reflow operation to form a solder joint in the microvia.

3. The method of claim 1, wherein the solder paste comprising solder balls of the first size extends laterally the microvia.

4. The method of claim 1, further comprising a single reflow operation to form a solder joint.

5. The method of claim 1, wherein the solder paste comprising solder balls of the second size is printed over the solder paste comprising the solder balls of the first size.

6. A method, comprising:
   filling a microvia formed in a bond pad with solder paste comprising solder balls of a first size; and
   printing a solder paste comprising solder balls of a second size over the solder paste comprising the solder balls of the first size, wherein the second size is greater than the first size.

* * * * *